(12) United States Patent
Cram et al.

(10) Patent No.: US 8,063,646 B2
(45) Date of Patent: Nov. 22, 2011

(54) APPARATUS AND METHODS FOR TESTING MICROELECTRONIC DEVICES

(75) Inventors: Daniel P. Cram, Boise, ID (US); A. Jay Stutzman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 696 days.

(21) Appl. No.: 11/509,292

(22) Filed: Aug. 23, 2006

(65) Prior Publication Data
US 2008/0048704 A1    Feb. 28, 2008

(51) Int. Cl.
*G01R 31/02* (2006.01)

(52) U.S. Cl. .......... 324/550; 337/186; 337/15; 340/638; 324/762.01

(58) Field of Classification Search .......... 324/754–765; 337/17, 15, 14, 97–98, 198; 361/835; 439/698
See application file for complete search history.

(56) References Cited

U.S. PATENT DOCUMENTS

| | | | | |
|---|---|---|---|---|
| 4,997,393 A * | 3/1991 | Armando | ................ | 439/620.21 |
| 5,145,414 A * | 9/1992 | Oikawa | .................... | 439/620.34 |
| 5,267,493 A * | 12/1993 | Yamagata et al. | ............... | 81/3.8 |
| 5,281,171 A * | 1/1994 | Job | ......................... | 439/620.26 |
| 5,566,445 A * | 10/1996 | Piao | ................................ | 29/741 |
| 5,662,496 A * | 9/1997 | Kanamori | ................ | 439/620.27 |
| 5,667,412 A * | 9/1997 | Takahashi et al. | ............ | 439/751 |
| 5,668,522 A * | 9/1997 | Kondo et al. | ................. | 337/198 |
| 5,751,208 A * | 5/1998 | Martinez | ....................... | 337/198 |
| 5,797,298 A * | 8/1998 | Grevel | ............................. | 81/3.8 |
| 5,861,858 A * | 1/1999 | Niekamp | ...................... | 343/800 |
| 5,941,735 A * | 8/1999 | Bernardini | .................... | 439/698 |
| 6,459,356 B1 * | 10/2002 | Dout et al. | .................... | 337/198 |
| 6,522,234 B1 * | 2/2003 | Sturgill | ......................... | 337/198 |
| 6,556,121 B2 * | 4/2003 | Endo et al. | .................... | 337/260 |
| 6,608,546 B2 * | 8/2003 | Andoh et al. | ................. | 337/260 |
| 7,044,807 B2 * | 5/2006 | Furuno et al. | ................. | 439/751 |
| 7,394,343 B2 * | 7/2008 | Cheng et al. | .................. | 337/265 |
| 2005/0239345 A1 * | 10/2005 | Furuno et al. | ................. | 439/751 |
| 2006/0214259 A1 * | 9/2006 | Spaunhorst | ................... | 257/529 |

* cited by examiner

*Primary Examiner* — Huy Q Phan
*Assistant Examiner* — Richard Isla Rodas
(74) *Attorney, Agent, or Firm* — Perkins Coie LLP

(57) ABSTRACT

Microelectronic devices, methods for testing microelectronic devices, and detachable electrical components. One embodiment of an apparatus for testing microelectronic devices in accordance with the invention comprises a board having a primary side, a secondary side, a plurality of test sites at the primary side, and electrical lines electrically coupled to the test sites. The testing apparatus can further include a plurality of lead holes in the board. Individual lead holes have a sidewall and a conductive section plated onto the sidewall. In several embodiments, individual pairs of first and second lead holes are electrically coupled to electrical lines corresponding to an associated test site. The apparatus can further include a plurality of permanent fuses fixed to the board. Individual permanent fuses are electrically coupled to electrical lines associated with an individual test site and an individual pair of first and second lead holes. The testing apparatus can further include a replacement fuse mounted to an individual pair of first and second lead holes at a test site having a blown permanent fuse. The replacement fuse has a first lead with a press-fit member engaged directly with the plated section in the first lead hole. The replacement fuse further includes a second lead engaged with the second lead hole and a fuse element connected in series with the first and second leads.

22 Claims, 5 Drawing Sheets

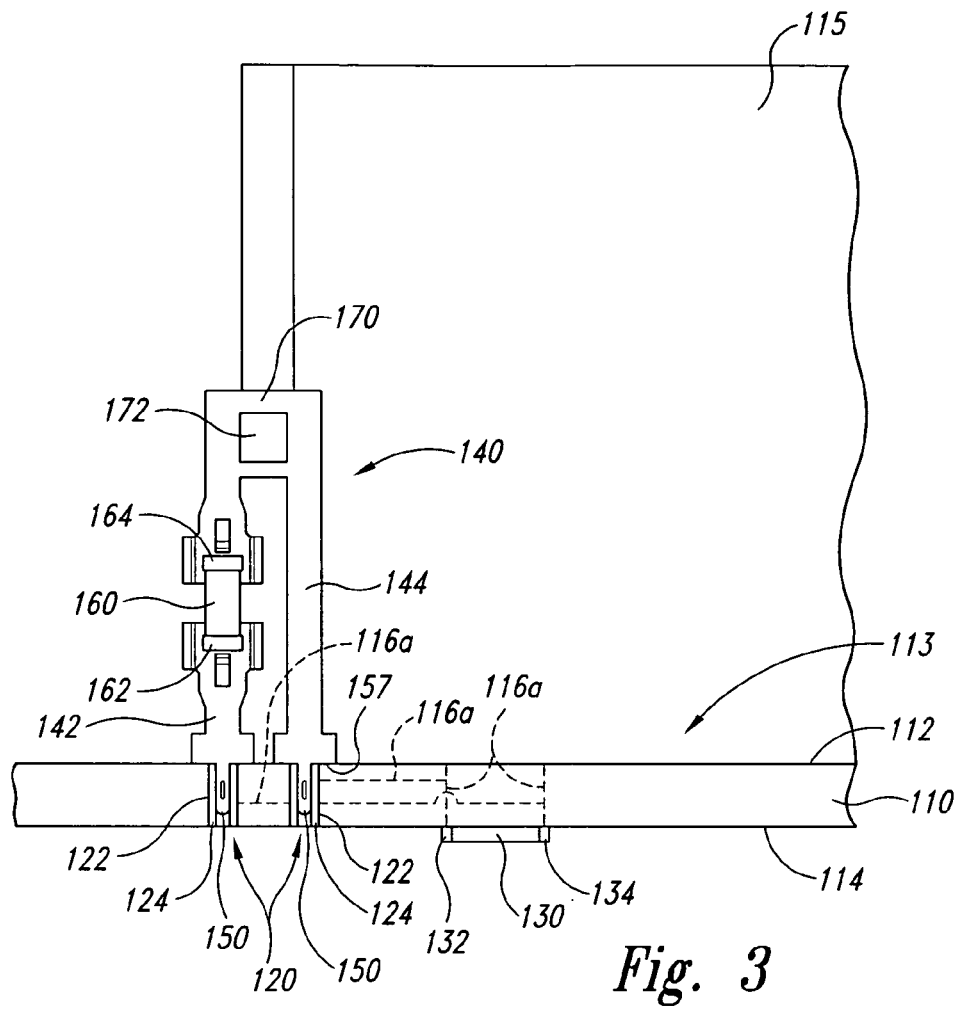
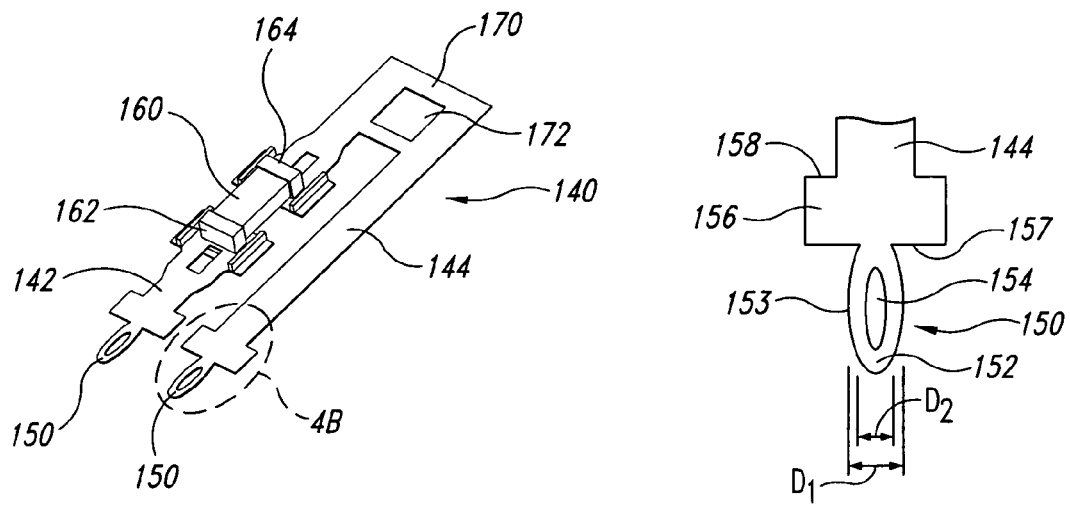
Fig. 3
Fig. 4A
Fig. 4B

APPARATUS AND METHODS FOR TESTING MICROELECTRONIC DEVICES

TECHNICAL FIELD

The present invention relates to apparatus and methods for testing microelectronic devices, micromechanical devices, and other types of microdevices.

BACKGROUND

Conventional packaged devices are manufactured for specific performance characteristics required for use in a wide range of electronic equipment. Packaged microelectronic devices typically include a die with integrated circuitry, a casing encapsulating the die, and an array of external contacts. Packaged microelectronic devices have an outer shape that defines a package profile. The external contacts can be pin-like leads or ball-pads of a ball-grid array. The ball-pads are arranged in a selected pattern, and solder balls are connected to the ball-pads. Different types of packaged devices with different circuitry can have the same ball-grid array but different outer profiles.

After the dies are packaged, the devices are generally tested and marked in several post-production batch processes. Burn-in testing is one such post-production process for detecting whether any of the devices are likely to fail. Burn-in testing is performed before shipping packaged devices to customers or installing packaged devices in electronic equipment.

Burn-in testing of packaged devices typically involves applying specified electrical biases and signals to the pins or ball-pads of the devices in a controlled temperature environment. The packaged devices are generally tested in more severe conditions and/or under more rigorous performance parameters than they are likely to experience during normal operation. During a typical burn-in test, several packaged devices are loaded onto burn-in boards, and a batch of loaded burn-in boards is then placed in a test chamber (i.e., burn-in oven) that provides a controlled environment.

Burn-in boards are commonly printed circuit boards that conduct the electrical input/output signals to the packaged devices. One example of a conventional burn-in board includes a printed circuit board and a plurality of test sockets on the printed circuit board. The test sockets each have a selected array of electrical leads electrically coupled to conductive lines in the printed circuit board. The electrical leads also have exposed contact tips positioned to engage solder balls of a packaged microelectronic device loaded into the socket.

Burn-in boards also have fuses to protect the circuitry in the test sockets from overloading, and other passive components can be attached to burn-in boards to control the electrical parameters at the sockets. FIG. 1 is a schematic side cross-sectional view of a burn-in board 10 having a primary side 12 with a test site 13 and a secondary side 14. The burn-in board 10 further includes a socket 15 at the test site 13 and a chip-fuse 16 attached to the secondary side 14 using surface mounting technology. The chip-fuse 16 has a first contact 17 and a second contact 18 electrically coupled to circuitry 19 associated with the test site 13. The burn-in board 10 can further include a plurality of holes 20 for receiving a fuse or other type of passive component that operates with the test site 13. Each hole 20 can have a sidewall covered by a plated section 22, and the burn-in board 10 can further include circuitry 26 that electrically couples the plated sections 22 to the test site 13. Burn-in boards generally have several hundred test sites that each have a socket, chip-fuse, and replacement holes. In conventional burn-in boards, fuse sockets 28 are soldered to the plated sections 22 in the holes 20 at each test site to receive a replacement fuse or other type of passive component.

Burn-in tests can cause a microdevice to overload and blow the chip-fuse 16 at the test site 13. In such cases, an axial-type replacement fuse 30 is generally inserted into the fuse sockets 28 so that the test site 13 can be used to test more devices. Conventional replacement fuses typically have a first lead 32, a second lead 34, and a fuse element 36 coupled to the first and second leads 32 and 34. The replacement lead 30 is passed between adjacent sockets 15 until the first lead 32 is received in a first fuse socket 28 and the second lead 34 is received in a second fuse socket 28. The test site 13 may then be used for testing additional devices even though the chip-fuse 16 is no longer operational.

One disadvantage of the conventional burn-in board 10 illustrated in FIG. 1 is that it is relatively expensive to assemble. When the burn-in board 10 is initially assembled, all of the fuse sockets 28 are attached to the primary side 12 because it is difficult to access the primary side 12 after the sockets 15 have been mounted to the board 10. Typical burn-in boards have hundreds of test sites, and thus it is time consuming to insert and solder each of the fuse sockets 28 to the holes 20. The cost of the fuse sockets 28 also increases the cost of the burn-in board 10. Moreover, many of the fuse sockets 28 are never used because many of the chip-fuses never blow during the life of the board 10. As a result, it is costly to assemble burn-in boards to accommodate axial-type replacement fuses 30.

Another disadvantage of the conventional burn-in board 10 illustrated in FIG. 1 is that the fuse sockets 28 are fairly large and occupy routing space between test sites 13. The electronics industry continuously pushes for smaller and higher performance devices, and thus the burn-in boards 10 must be able to accommodate microelectronic devices with more input/output pins. As a result, the space occupied by the fuse sockets 28 can limit whether the burn-in boards can be used to test high-performance devices.

Another disadvantage of the conventional burn-in board 10 illustrated in FIG. 1 is that the axial-type replacement fuse 30 may not have the same electrical properties as the chip-fuse 16. As a result, when the chip-fuse 16 blows, the test site 13 may need to be recalibrated after the replacement fuse 30 is installed. This requires additional time that increases the cost and reduces the throughput of operating the burn-in board 10.

BRIEF DESCRIPTION OF THE DRAWINGS

FIG. 3 is a cross-sectional view of a portion of the testing apparatus and the detachable electronic component shown in FIG. 2 taken along line 3-3.

FIG. 4A is an isometric view of a detachable electronic component in accordance with an embodiment of the invention.

FIG. 4B is a front elevational view of a portion of the detachable electronic component shown in FIG. 4A.

DETAILED DESCRIPTION

A. Overview

Figure 1:
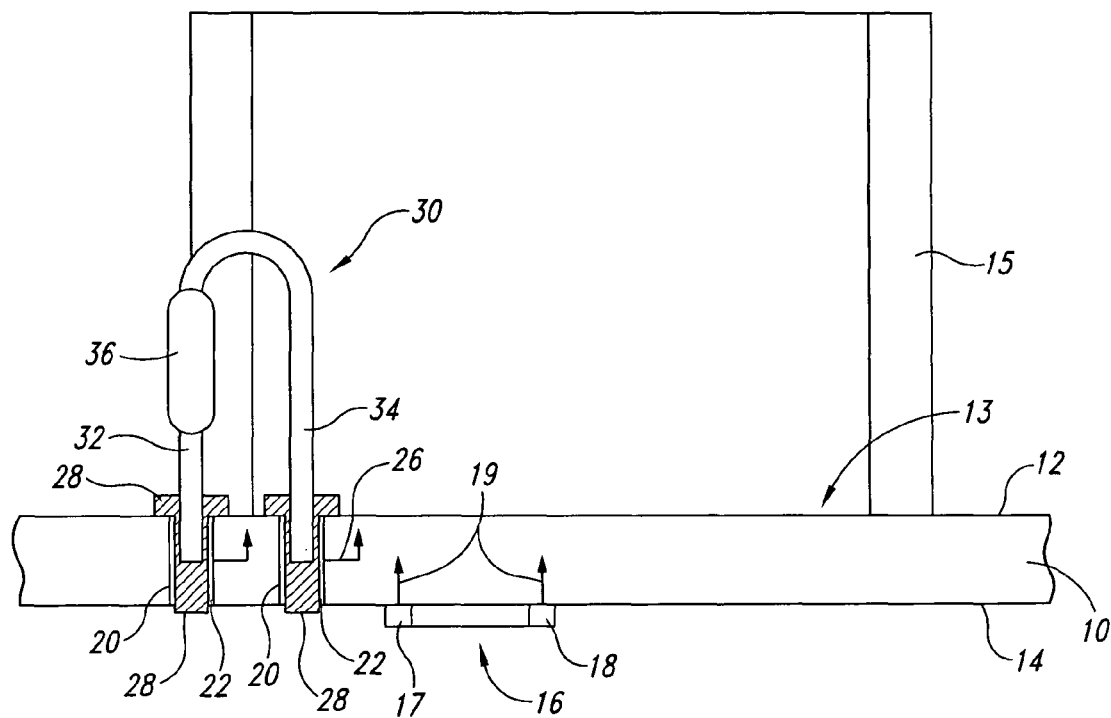
FIG. 1 is a schematic side cross-sectional view illustrating a portion of a burn-in board in accordance with the prior art.

The present disclosure is directed toward an apparatus for testing microelectronic devices, methods for testing microelectronic devices, and detachable electronic components. One embodiment of the invention is an apparatus for testing microelectronic devices. A specific embodiment of such an apparatus for testing microelectronic devices in accordance with the invention comprises a board having a primary side, a secondary side, a plurality of test sites at the primary side, and electrical lines electrically coupled to the test sites. The testing apparatus can further include a plurality of lead holes in the board. Individual lead holes have a sidewall and a conductive section plated onto the sidewall. In several embodiments, individual pairs of first and second lead holes are electrically coupled to electrical lines corresponding to an associated test site. The apparatus can further include a plurality of permanent fuses fixed to the board. Individual permanent fuses are electrically coupled to electrical lines associated with an individual test site and an individual pair of first and second lead holes. The testing apparatus can further include a replacement fuse mounted to an individual pair of first and second lead holes at a test site having a blown permanent fuse. The replacement fuse has a first lead with a press-fit member engaged directly with the plated section in the first lead hole. The replacement fuse further includes a second lead engaged with the second lead hole and a fuse element connected in series with the first and second leads.

Another embodiment of the invention is a detachable electronic component for use in a board having a lead hole with a sidewall and a conductive section plated onto the sidewall. A specific embodiment of such a detachable electronic component comprises a first lead, a press-fit member at an end of the first lead, and a second lead. The press-fit member has a distal tip configured to pass into the lead hole and a contact section configured to engage the conductive section on the sidewall of the lead hole. The contact section is further configured to exert an outward force against the conductive section. The electrical component further includes an electrical element having a first contact connected to the first lead and a second contact connected to the second lead such that the electrical component is connected in series with the first and second leads. The detachable electrical component further includes a handle fixed to at least one of the first and second leads.

Another embodiment of the invention is directed toward a fuse for use in a test board having a lead hole with a sidewall and a conductive section on the sidewall. In this embodiment, the fuse includes a first lead, a press-fit member at an end of the first lead, and a second lead. The press-fit member has a distal tip configured to pass into the lead hole and a contact section configured to engage the conductive section on the sidewall such that the contact section exerts an outward force against the conductive section. The fuse further includes a chip-fuse element having a first contact connected to the first lead and a second contact connected to the second lead such that the chip-fuse element is connected in series with the first and second leads. The fuse further includes a handle fixed to at least one of the first and second leads.

Another embodiment of the invention is directed toward a method for repairing a test site on a test board in the testing of microelectronic devices. One specific embodiment of such a method comprises identifying a test site on the test board having a faulty permanent fuse and providing a detachable replacement fuse. The detachable replacement fuse has a first lead, a press-fit member at one end of the first lead, a second lead, and a fuse element connected in series with the first and second leads. The method further comprises inserting the press-fit member into a first hole in the test board such that the first press-fit member directly engages a plated section in the first hole. The method further includes inserting the second lead into a second hole in the test board. The first and second holes are electrically connected to the test site such that the replacement fuse operates in the place of the faulty permanent fuse.

Another embodiment of a method for repairing a test site comprises locating a test site having a socket with contact pins, a first lead hole having a first sidewall with a first plated section on the first sidewall, a second lead hole having a second sidewall with a second plated section on the second sidewall, and a permanent fuse that has blown. The method further includes attaching a replacement fuse to the test site by inserting a first press-fit member into the first hole and a second press-fit member into the second hole. The first press-fit member exerts an outward force directly against the first plated section, and the second press-fit member exerts an outward force directly against the second plated section. The first press-fit member is attached to the first lead of the replacement fuse, and the second press-fit member is attached to the second lead of the replacement fuse.

Another embodiment of the invention is directed toward methods for testing microelectronic components. One specific embodiment of such a method comprises locating a test site having a socket with contact pins, a first lead hole having a first sidewall with a first plated section on the first sidewall, a second lead hole having a second sidewall with a second plated section on the second sidewall, and a permanent fuse that has blown. The method further includes attaching a replacement fuse to the test site by inserting a first press-fit member into the first hole and inserting a second press-fit member into the second hole. The first press-fit member exerts an outward force directly against the first plated section, and the second press-fit member exerts an outward force directly against the second plated section. The first press-fit member is fixed to a first lead of the replacement fuse, and the second press-fit member is fixed to a second lead of the replacement fuse. This method further includes placing a microelectronic device into the socket at the test site, and applying input signals and receiving output signals via the contact pins after attaching the replacement fuse to this test site.

Specific details of several embodiments are described below with reference to burn-in boards with replacement fuses for testing semiconductor devices or other types of microelectronic devices. However, other embodiments can include other types of printed circuit boards with active or passive electronic components that are press-fit onto the boards. Several details describing well known structures or processes often associated with testing or fabricating microelectronic devices are not described herein for purposes of brevity. Also, several of the embodiments can have different configurations, components, or procedures than those described in this section. A person of ordinary skill in the art, therefore, will accordingly understand that the invention may have other embodiments with additional elements, or that the invention may have other embodiments without several of the features and elements shown and described below with reference to FIGS. 2-6.

B. Embodiments of Testing Apparatus and Detachable Electronic Components

Figure 2:
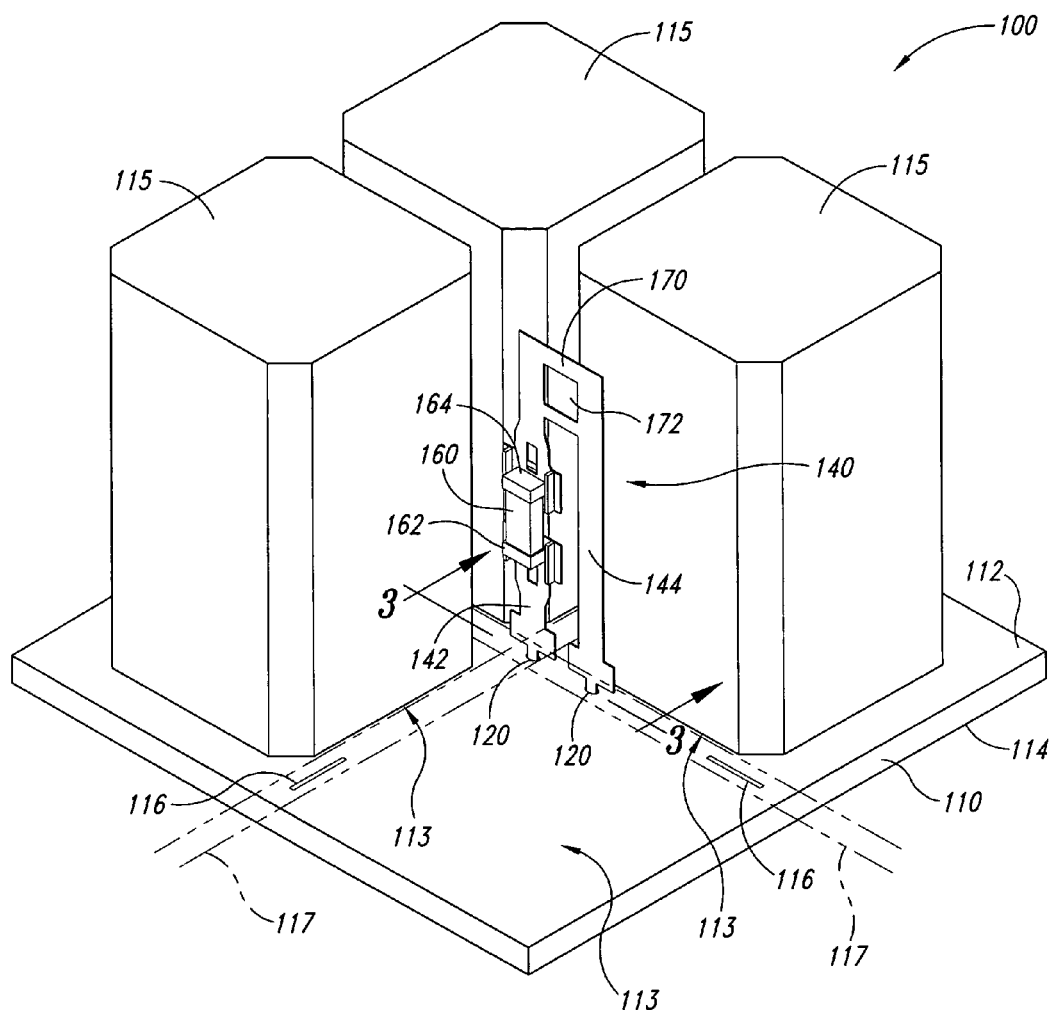
FIG. 2 is an isometric view of a portion of a testing apparatus with a detachable electronic component in accordance with an embodiment of the invention.

FIG. 2 is an isometric view of a testing apparatus 100 in accordance with an embodiment of the invention, and FIG. 3 is a cross-sectional view of a portion of the testing apparatus 100 taken along line 3-3 shown in FIG. 2. Several features of the testing apparatus 100 are shown schematically in FIGS. 2 and 3. The testing apparatus 100 includes a test board 110 having a primary side 112, a secondary side 114, and a plurality of test sites 113 (only one test site is shown in FIG. 3). In the illustrated embodiment shown in FIGS. 2 and 3, the testing apparatus 100 includes a plurality of sockets 115 attached to the test board 110 at corresponding test sites 113. The sockets 115 can be configured to receive packaged microelectronic devices, bare dies, or other types of microdevices for burn-in testing or other types of testing. Suitable sockets are shown and described in U.S. Publication No. 2005/0134299, which is incorporated herein by reference. The test board 110 further includes electrical lines 116 (shown schematically) electrically coupled to the test sites 113. The electrical lines 116 can be located throughout the test board 110, but several of the electrical lines 116 are located in routing lanes 117 (shown in broken lines) between the test sites 113.

Referring to FIG. 3, the board 110 further includes a plurality of lead holes 120. The lead holes 120 can be through holes that pass completely through the board 110 such that they extend from the primary side 112 to the secondary side 114. Individual lead holes 120 have a sidewall 122 and a conductive section 124 on the sidewall 122. The conductive sections 124 can be plated copper or other metals deposited onto the sidewalls 122 such that the conductive sections 124 are integral with the board 110. The conductive sections 124 are electrically coupled to electrical lines 116a that are routed to a specific test site 113 through the board 110. The electrical lines 116a can be a subset of the electrical lines 116 described above with reference to FIG. 2.

The testing apparatus 100 further includes a plurality of permanent fuses 130 (only one shown in FIG. 3) fixed to the test board 110. In the illustrated example, the permanent fuses 130 are surface-mount chip-fuses fixed to the secondary side 114 of the test board 110. Individual permanent fuses 130 include first contacts 132 and 134 coupled to electrical lines associated with a specific test site and a specific pair of lead holes 120. As shown in FIG. 3, for example, the permanent fuse 130 is electrically coupled to the electrical lines 116a associated with the specific test site 113 and pair of lead holes 120. As a result, if the permanent fuse 130 blows, a replacement fuse can be inserted into the corresponding lead holes 120 to repair the associated test site 113.

FIG. 4A is an isometric view of a replacement fuse 140 for use with the test board 110 in accordance with an embodiment of the testing apparatus 100. The replacement fuse 140 is one example of a detachable electronic component. The embodiment of the replacement fuse 140 illustrated in FIG. 4A includes a first lead 142 having a first press-fit member 150 and a second lead 144 having a second press-fit member 150. The press-fit members 150 can be identical to each other, but the first press-fit member can be different than the second press-fit member depending upon the particular test board 110. The press-fit members 150 are fixed with respect to the first and second leads 142 and 144. For example, the press-fit members 150 can be integral with the first and second leads 142 and 144. In one specific embodiment, the first lead 142, the second lead 144, and the press-fit members 150 are stamped from a thin sheet of conductive material. In other embodiments, the first and second leads 142 and 144 can be wires or other conductive members, and the press-fit members 150 can be separately fixed relative to the first and second leads 142 and 144 using a solder or other type of fixed attachment. As explained below, the press-fit members 150 are configured to pass into the lead holes in the test board and engage the conductive sections on the sidewalls to electrically and mechanically attach the replacement fuse 140 to a test site having a blown permanent fuse.

FIG. 4B illustrates an embodiment of the press-fit member 150 in more detail. In this embodiment, the press-fit member 150 includes a distal tip 152 having a dimension less than a lateral dimension of a lead hole in which the press-fit member 150 is to be inserted. The press-fit member 150 further includes a contact section 153 having a dimension larger than the lateral dimension of such a lead hole. The press-fit member 150 can include an opening 154 to allow the contact section 153 to deform or otherwise flex inwardly as the press-fit member 150 moves into a lead hole. For example, the contact sections 153 can flex inwardly from a first dimension $D_1$ to a second dimension $D_2$. As a result, the contact sections 153 of the press-fit members 150 can be flexible members that exert an outward force in two or more directions against the lead holes. The press-fit member 150 can further include a flange 156 having a stop surface 157 to limit the insertion of the distal tip into a lead hole and a drive surface 158 configured to be engaged by an insertion tool as explained in more detail below.

Referring back to FIG. 4A, the replacement fuse 140 further includes a fuse element 160 having a first contact 162 and a second contact 164. The first contact 162 can be attached to the first lead 142, and the second contact 164 can be attached to the second lead 144 such that the fuse element 160 is connected in series with the first lead 142 and the second lead 144. The fuse element 160 can be a chip-fuse having properties that are identical, or at least substantially similar, to the electrical properties of the permanent fuse 130 for the corresponding test site 113. In other embodiments, the fuse element 160 may be a conventional fuse.

FIGS. 2 and 3 illustrate an embodiment of the testing apparatus 100 with a replacement fuse 140 installed at the test site 113. In this example, the press-fit members 150 (FIG. 3) are inserted into the lead holes 120 such that the press-fit members 150 exert an outward force against the conductive sections 124 (FIG. 3). The friction between the press-fit members 150 and the conductive sections 124 secures the replacement fuse 140 to the test board 110 and electrically connects the leads 142 and 144 to the conductive sections 124. As such, the replacement fuse 140 is electrically coupled to the electrical lines 116a to replace the permanent fuse 130. It will be appreciated that the replacement fuse 140 is usually attached to the test board 110 only in the event that the permanent fuse 130 has blown.

The replacement fuse 140 can reside above the routing lanes 117 between adjacent sockets 115 as long as necessary. If the replacement fuse 140 blows to protect the corresponding socket 115, another replacement fuse 140 can be inserted into the lead holes 120 to repair the test site 113. More specifically, the replacement fuse 140 can further include a handle 170 for extracting the replacement fuse 140. The handle 170 can be a cross-bar, such as a portion of the second lead 144. The illustrated embodiment of the handle 170 includes an opening 172 for receiving an extraction tool (not shown). The handle 170 can be formed integrally with the first lead 142 and/or the second lead 144 as shown in FIG. 3, or the handle 170 can be a separate component attached to one or both of the leads. To extract a blown replacement fuse 140, a projection of an extraction tool can be inserted into the opening 172 of the handle 170, and then an upward force can be exerted against the handle 170 to extract the replacement fuse 140.

Figure 5:
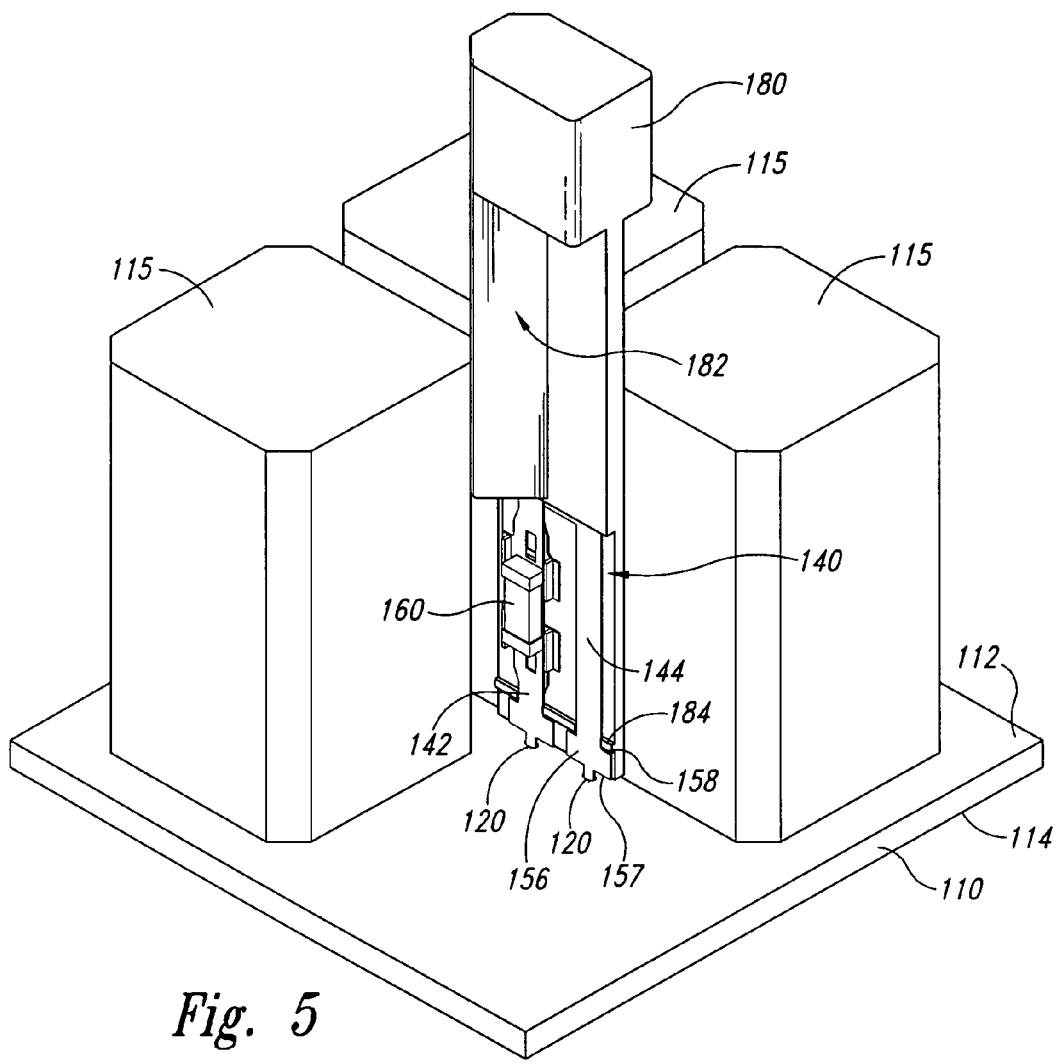
FIG. 5 is an isometric view illustrating the operation of the testing apparatus and the detachable electronic component in accordance with an embodiment of the invention.

FIG. 5 is an isometric view illustrating an embodiment of an insertion tool 180 for attaching the replacement fuse 140 to the test board 110. The replacement tool 180 has a guide surface 182 configured to closely engage the outer surfaces of the adjacent sockets 115 in a manner that aligns the first and second leads 142 and 144 with corresponding lead holes 120 in the test board 110. The alignment tool 180 further includes drive elements 184 configured to engage the drive surfaces 158 of the flanges 156. In operation, the insertion tool 180 moves downwardly between adjacent sockets 115 as the guide surfaces 182 align the press-fit members 150 (best shown in FIG. 3) with the lead holes 120. The drive elements 184 exert a drive force against the drive surface 158 until the stop surface 157 engages the primary side 112 of the test board 114. The insertion tool 180 is then withdrawn from between the sockets 115 to leave the replacement fuse 140 electrically and mechanically coupled to the lead holes 120.

Several embodiments of the test board 110 and the replacement fuse 140 eliminate the need for the fuse sockets to be inserted into the lead holes of the test board. More specifically, because the press-fit elements 150 mechanically and electrically couple the first and second leads 142 and 144 directly to the lead holes 120, it is not necessary to insert and solder separate test sockets into the lead holes. Such embodiments can save a significant amount of time in assembling the test board and eliminates the cost of the test sockets. Several embodiments of the test board 110 and the replacement fuse 140 are accordingly expected to reduce the costs of assembling test boards. Additionally, eliminating the conventional fuse sockets for axial-type replacement fuses allows the lead holes to be smaller. This reduces the real estate occupied by the lead holes so that more electrical lines can be located in the routing lanes 117 to accommodate high performance devices without adding more layers to the boards.

Many embodiments of the replacement fuse 140 can also have a chip-fuse element that is identical, or at least substantially similar, to the chip-type permanent fuse surface mounted to the secondary side of the board. As a result, the electrical properties of the repaired sites do not change after a permanent fuse has blown. This is expected to enhance the accuracy and increase the ease with which test sites are repaired.

C. Additional Embodiments of Detachable Electronic Devices

Figure 6:
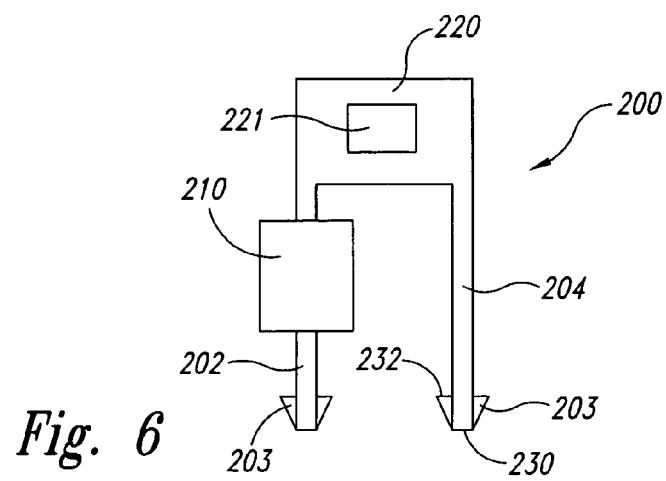
FIG. 6 is a side schematic view illustrating a detachable electronic component in accordance with another embodiment of the invention.

FIG. 6 is a side schematic view of a detachable electronic component 200 in accordance with another embodiment of the invention. The detachable electronic component 200 includes a first lead 202 having a first press-fit element 203 and a second lead 204 having a second press-fit element 203. The device 200 further includes an electrical element 210 and a handle 220 having an opening 221 for receiving a portion of an extraction tool as described above. The electrical element 210 can be a capacitor, resistor, memory chip, sensor, or other type of electrical device. The electrical component 210 may be optional such that the first lead 202 is directly connected to the second lead 204 across the handle 220 to provide a jumper link. The press-fit elements 203 can have a distal tip 230 configured to fit into a lead hole and a contact section 232 configured to engage a sidewall of a lead hole as described above with reference to the press-fit elements 150. In operation, therefore, the detachable electronic component 200 can be any suitable electronic component for detachable insertion into a test board or other type of electrical device.

Figure 7:
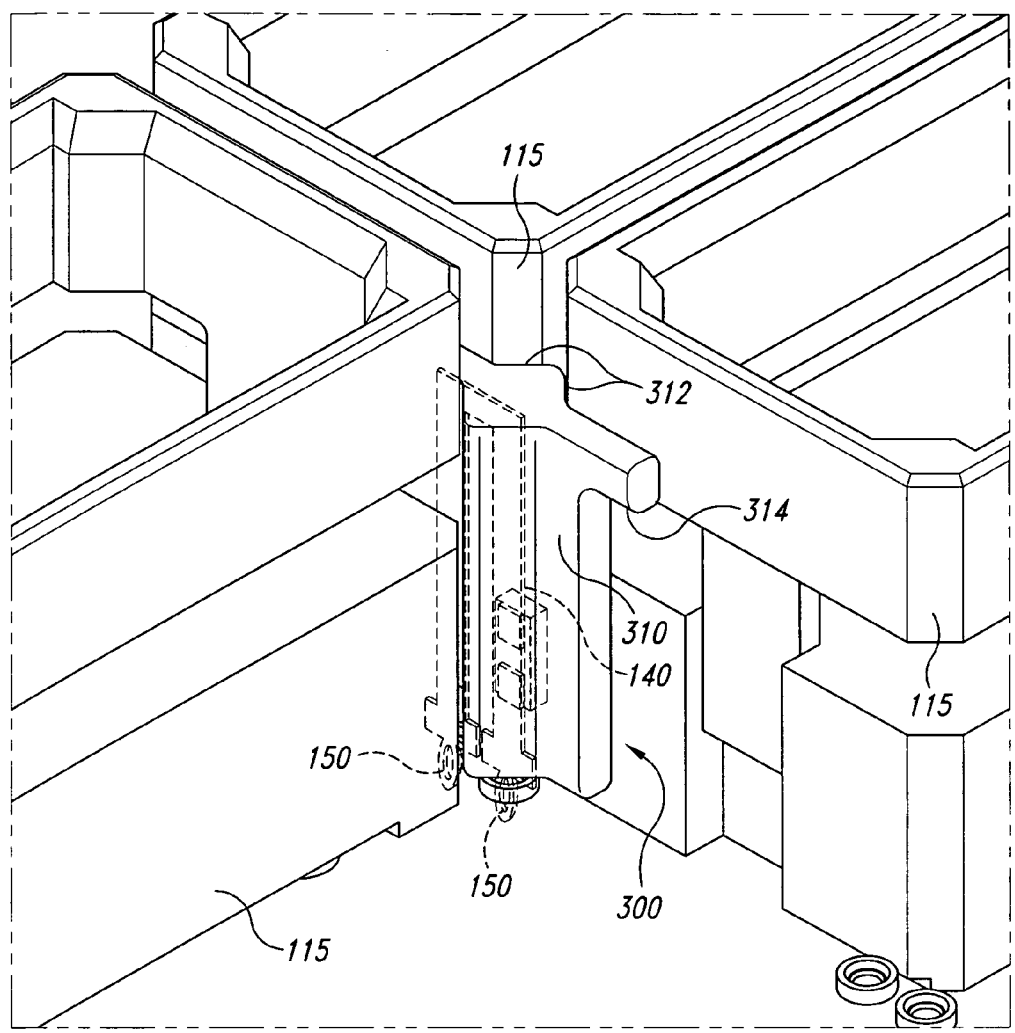
FIG. 7 is an isometric view illustrating a detachable electronic component in accordance with another embodiment of the invention.

FIG. 7 is an isometric view illustrating another embodiment of an electronic component 300. In this embodiment, the electronic component has a detachable fuse 140 as described above and a casing 310 around a portion of the fuse 140. The casing 310 can be a dielectric material that is molded around the fuse 140, or the casing 310 can be a dielectric housing to which the fuse 140 is attached. The casing 310, for example, can be formed by injection molding a thermoplastic compound around the fuse element, a portion of the first lead, and a portion of the second lead. The press-fit members 150 of the first and/or second leads are generally not covered by the casing 310 so that they can be electrically coupled to lead holes in the board 110. In the embodiment shown in FIG. 7, the casing 310 has guide surfaces 312 configured to guide the press-fit members 150 into corresponding lead holes and a handle 314 configured to be engaged by a removal tool. The handle 314, for example, can be (a) a loop or hole in the casing, (b) a projection extending from the casing, and/or (c) a recess in the casing. In operation, the guide surfaces 312 slide along corresponding surfaces of adjacent sockets 115 to align the press-fit members 150 with corresponding lead holes for installation. To remove the electronic component 300, a curved pick, pliers, or other existing tools can be used to grip the handle 314 and extract the component 300 from between the sockets 115. Embodiments of the electronic component 300 can accordingly be installed and extracted without specialized tools.

From the foregoing, it will be appreciated that specific embodiments of the invention have been described herein for purposes of illustration, but that various modifications may be made without deviating from the spirit and scope of the invention. For example, although the foregoing embodiments are described with respect to burn-in boards, other embodiments can include other types of printed circuit boards with detachable press-fit electronic components. Accordingly, the invention is not limited except as by the appended claims.

We claim:

1. A method for repairing a test site on a test board in the testing of microelectronic devices, the method comprising:

identifying a test site on the test board having a faulty permanent fuse and a plurality of socket components that protrude from the test site;

providing a detachable replacement fuse, the detachable replacement fuse having a first lead, a first press-fit member at one end of the first lead, a second lead, a fuse element connected in series with the first and second leads, and a handle attached to the second lead with an opening in the handle;

inserting the first press-fit member into a first lead hole in the test board such that the first press-fit member directly engages a plated section in the first lead hole and inserting the second lead into a second lead hole in the test board, wherein the first and second lead holes are electrically connected to the test site such that the detachable replacement fuse operates in the place of the faulty permanent fuse;

testing at least one microelectronic component at the test site; and extracting the detachable replacement fuse from the test site by inserting a projection of an extraction tool between the socket components and into the opening in the handle, wherein the extraction tool comprises a guide surface that substantially matches an external surface of the socket components, and wherein the guide surface guides the extraction tool into place relative to the test board.

2. The method of claim 1, wherein the replacement fuse further comprises a second press-fit member fixed to the second lead and the method further comprises inserting the second press-fit member into the second lead hole such that the second press-fit member directly engages a plated section in the second lead hole.

3. The method of claim 1 wherein the method further comprises gripping the handle with an insertion tool and sliding the insertion tool along portions of first and second sockets to guide the first press-fit member into the first hole.

4. The method of claim 1 wherein the fuse element comprises a chip-fuse, and wherein the method further comprises providing a chip-fuse having electrical properties at least substantially the same as those of the faulty permanent fuse.

5. The method of claim 1 wherein the first press-fit member has a contact section and an opening in the contact section, and wherein inserting the first press-fit member into the first lead hole comprises driving the first press-fit member axially into the first lead hole such that the contact section deforms inwardly toward the opening and exerts a laterally directed force against the plated section of the first lead hole.

6. A method for repairing a test site on a test board in the testing of microelectronic devices, comprising:
locating a test site having a socket with contact pins, a first lead hole having a first sidewall with a first plated section on the first sidewall, a second lead hole having a second sidewall with a second plated section on the second sidewall, and a permanent fuse that has blown;
attaching a replacement fuse to the test site by inserting a tool holding a first press-fit member between socket components on the test board, wherein the tool has projections that match a surface of the socket components such that the socket components guide the tool between the socket components to align the first press-fit member into the first lead hole such that the first press-fit member exerts an outward force directly against the first plated section and inserting a second press-fit member into the second lead hole such that second press-fit member exerts an outward force directly against the second plated section, wherein the first press-fit member is attached to a first lead of the replacement fuse and the second press-fit member is attached to a second lead of the replacement fuse, and wherein the replacement fuse has a handle;
testing at least one microelectronic device; and
extracting the replacement fuse from the test site with an extraction tool configured to engage the handle.

7. The method of claim 6 wherein the replacement fuse comprises a chip-fuse, and wherein the method further comprises providing a chip-fuse having electrical properties at least substantially the same as those of the blown permanent fuse.

8. A method of testing a microelectronic component, comprising:
locating a test site having a socket with contact pins, a first lead hole having a first sidewall with a first plated section on the first sidewall, a second lead hole having a second sidewall with a second plated section on the second sidewall, and a permanent fuse that has blown, wherein the test site is adjacent to at least one socket component that protrudes from the test site and has at least one guide surface extending substantially normal to a surface of the test site;
aligning a replacement fuse with the first and second lead holes by holding the replacement fuse in an insertion tool and moving a surface of the insertion tool against the guide surface of the socket component;
attaching the replacement fuse to the test site by inserting a first press-fit member into the first lead hole such that the first press-fit member exerts an outward force directly against the first plated section and inserting a second press-fit member into the second lead hole such that the second press-fit member exerts an outward force directly against the second plated section, wherein the first press-fit member is fixed with respect to a first lead of the replacement fuse and the second press-fit member is fixed with respect to a second lead of the replacement fuse, and wherein the replacement fuse comprises a handle with an opening;
placing a microelectronic device into the socket at the test site;
applying input signals and receiving output signals via the contact pins after attaching the replacement fuse to the test site; and
removing the replacement fuse from the test site by using an extraction tool inserted into the opening of the handle.

9. The method of claim 8 wherein the replacement fuse further comprises a handle attached to at least one of the first and second leads, and wherein the method further comprises gripping the handle with a tool and sliding the tool along portions of first and second sockets to guide the first press-fit member into the first hole.

10. The method of claim 8 wherein the permanent fuse that has blown comprises a chip-fuse, and wherein attaching the replacement fuse comprises attaching a chip-fuse having electrical properties at least substantially the same as those of the faulty permanent fuse.

11. An apparatus for testing microelectronic devices, comprising:
a board having a primary side, a secondary side, a plurality of test sites at the primary side, and electrical lines electrically coupled to the test sites;
a plurality of lead holes in the board, wherein individual lead holes have a sidewall and a conductive section plated on the sidewall, and wherein individual pairs of first and second lead holes are electrically coupled to electrical lines corresponding to an associated test site;
a plurality of sockets attached to the primary side and having a guide surface between at least two of the sockets;
a plurality of permanent fuses fixed to the board, wherein individual permanent fuses are electrically coupled to electrical lines associated with an individual test site and an individual pair of first and second lead holes; and
a replacement component mounted to an individual pair of first and second lead holes at a test site between at least two sockets, the test site having a blown permanent fuse, wherein the replacement component has a first lead with a press-fit member engaged directly with the conductive section in the first lead hole, a second lead engaged with the second lead hole, a fuse element connected in series with the first lead and the second lead, and a handle formed integrally with the first and second leads, wherein the first and second leads have a drive surface configured to be engaged by an insertion tool, and wherein the replacement component is shaped to fit between the sockets and to use the guide surface to align the first and second leads with the first and second lead holes, respectively, and further wherein the sockets maintain their shape as the first and second leads are aligned with the first and second lead holes.

12. The apparatus of claim 11 wherein the press-fit member comprises a distal tip having a dimension less than a lateral dimension across the first lead hole and a contact section having a dimension larger than the lateral dimension across the first lead hole.

13. The apparatus of claim 11 wherein the press-fit member comprises a distal tip configured to pass into the first lead hole and a contact section configured to engage the conductive section on the sidewall of the first lead hole and exert an outward force against the conductive section.

14. The apparatus of claim 11 wherein the permanent fuses comprise surface-mount chip-fuses and the fuse element comprises a surface-mount chip-fuse.

15. The apparatus of claim 11 wherein the second lead has a second press-fit member engaged with the conductive section in the second lead hole.

16. The apparatus of claim 11 wherein the first and second leads each have a drive surface configured to be engaged by an insertion tool.

17. The apparatus of claim 11 wherein the fuse element is positioned along the first lead, and the second lead has an electrically conductive cross-bar connected to the first lead that defines the handle.

18. An apparatus for testing microelectronic devices, comprising:
    a board having a primary side, a secondary side, a plurality of test sites at the primary side, and electrical lines electrically coupled to the test sites;
    a plurality of lead holes in the board, wherein individual lead holes have a sidewall and a conductive section plated on the sidewall, and wherein individual pairs of first and second lead holes are electrically coupled to electrical lines corresponding to an associated test site;
    a plurality of permanent fuses fixed to the board, wherein individual permanent fuses are electrically coupled to electrical lines associated with an individual test site and an individual pair of first and second lead holes;
    a replacement fuse mounted to an individual pair of first and second lead holes at a test site having a blown permanent fuse, wherein the replacement fuse has a first lead with a flexible member engaged directly with the conductive section in the first lead hole, a second lead engaged with the second lead hole, and a fuse element connected in series with the first lead and the second lead;
    a handle connected to the replacement fuse with the replacement fuse between the handle and the flexible member, the handle being configured to interface with an insertion tool to concurrently insert or extract the first and second leads from the first and second lead holes; and
    a socket attached to the board, the socket having a guide surface configured to contact at least one of the handle or the insertion tool to guide the replacement fuse into place on the board, wherein the socket is configured to maintain its shape as the replacement fuse is inserted or extracted.

19. The apparatus of claim 18 wherein the flexible member comprises a distal tip having a dimension less than a lateral dimension across the first lead hole and an contact section having a dimension larger than the lateral dimension across the first lead hole.

20. The apparatus of claim 18 wherein the flexible member comprises a distal tip configured to pass into the first lead hole and a contact section configured to engage the conductive section on the sidewall of the first and exert an outward force in at least two directions against the conductive section.

21. The apparatus of claim 18 wherein the replacement fuse further comprises a handle attached to at least one of the first and second leads.

22. The apparatus of claim 18 wherein the insertion tool has a guide surface configured to engage an external surface of a socket component that extends generally normal to the primary side of the test board and to guide the replacement fuse into position with respect to the lead holes.

* * * * *